(12) United States Patent
Huang et al.

(10) Patent No.: US 9,679,883 B2
(45) Date of Patent: Jun. 13, 2017

(54) HOLLOW METAL PILLAR PACKAGING SCHEME

(71) Applicant: Taiwan Semiconductor Manufacturing Company, Ltd., Hsin-Chu (TW)

(72) Inventors: Chang-Pin Huang, Yangmei Township (TW); Hsien-Ming Tu, Zhubei (TW); Hsien-Wei Chen, Hsin-Chu (TW); Tung-Liang Shao, Hsin-Chu (TW); Ching-Jung Yang, Pingzhen (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/095,765

(22) Filed: Apr. 11, 2016

(65) Prior Publication Data

US 2016/0225751 A1     Aug. 4, 2016

Related U.S. Application Data

(62) Division of application No. 14/030,157, filed on Sep. 18, 2013, now Pat. No. 9,343,417.

(51) Int. Cl.
*H01L 21/44* (2006.01)
*H01L 25/00* (2006.01)
(Continued)

(52) U.S. Cl.
CPC .............. *H01L 25/50* (2013.01); *H01L 21/56* (2013.01); *H01L 21/566* (2013.01); *H01L 23/3192* (2013.01); *H01L 23/562* (2013.01); *H01L 24/11* (2013.01); *H01L 24/13* (2013.01); *H01L 24/81* (2013.01); *H01L 25/0657* (2013.01); *H01L 23/293* (2013.01); *H01L 2224/03914* (2013.01); *H01L 2224/0401* (2013.01); *H01L 2224/05008* (2013.01); *H01L 2224/05548* (2013.01); *H01L 2224/05567* (2013.01); *H01L 2224/05647* (2013.01); *H01L 2224/1134* (2013.01); *H01L 2224/1147* (2013.01); *H01L 2224/1181* (2013.01); *H01L 2224/1182* (2013.01); *H01L 2224/1191* (2013.01); *H01L 2224/11462* (2013.01); *H01L 2224/13005* (2013.01); *H01L 2224/13011* (2013.01); *H01L 2224/13012* (2013.01); *H01L 2224/13016* (2013.01); *H01L 2224/13022* (2013.01); *H01L 2224/13024* (2013.01); *H01L 2224/13111* (2013.01); *H01L 2224/13124* (2013.01); *H01L 2224/13139* (2013.01); *H01L 2224/13147* (2013.01);
(Continued)

(58) Field of Classification Search
CPC . H01L 21/56; H01L 23/562; H01L 21/76885; H01L 21/566
USPC ................................. 438/637, 639, 672, 675
See application file for complete search history.

(56) References Cited

U.S. PATENT DOCUMENTS 6,239,016 B1* 5/2001 Ishikawa ........... H01L 21/76801
257/E21.576
7,700,986 B2    4/2010 Huang et al.
(Continued)

*Primary Examiner* — S. V. Clark
(74) *Attorney, Agent, or Firm* — Slater Matsil, LLP

(57) ABSTRACT

An integrated circuit includes a bottom substrate, a metal layer disposed over the bottom substrate and a hollow metal pillar disposed on the metal layer. The metal layer and the hollow metal pillar are electrically connected.

20 Claims, 5 Drawing Sheets

(51) Int. Cl.
*H01L 23/00* (2006.01)
*H01L 23/31* (2006.01)
*H01L 21/56* (2006.01)
*H01L 25/065* (2006.01)
*H01L 23/29* (2006.01)

(52) U.S. Cl.
CPC ............... *H01L 2224/14131* (2013.01); *H01L 2224/16145* (2013.01); *H01L 2224/16148* (2013.01); *H01L 2224/16225* (2013.01); *H01L 2224/16227* (2013.01); *H01L 2224/81193* (2013.01); *H01L 2224/81411* (2013.01); *H01L 2224/81815* (2013.01); *H01L 2225/06513* (2013.01); *H01L 2924/014* (2013.01); *H01L 2924/01008* (2013.01); *H01L 2924/01018* (2013.01); *H01L 2924/181* (2013.01); *H01L 2924/351* (2013.01)

(56) References Cited

U.S. PATENT DOCUMENTS

| | | |
|---|---|---|
| 8,519,472 B2 | 8/2013 | Jeong et al. |
| 2009/0072398 A1* | 3/2009 | Irsigler ............... H01L 23/5389 257/741 |
| 2010/0013068 A1 | 1/2010 | Huang et al. |
| 2013/0161787 A1 | 6/2013 | Kim et al. |
| 2013/0241071 A1* | 9/2013 | Hsieh ..................... H01L 24/13 257/773 |
| 2015/0348991 A1* | 12/2015 | Simsek-Ege ........ H01L 27/1157 438/268 |

* cited by examiner

HOLLOW METAL PILLAR PACKAGING SCHEME

PRIORITY CLAIM

This application claims the benefit to and is a divisional of U.S. patent application Ser. No. 14/030,157, filed on Sep. 18, 2013, and entitled "Hollow Metal Pillar Packaging Scheme" which application is incorporated herein by reference.

TECHNICAL FIELD

The present disclosure relates generally to an integrated circuit and more particularly a hollow metal pillar packaging scheme.

BACKGROUND

For integrated circuit packaging, board level thermal cycling tests are used to test the wafer level package. One failure mechanism is solder ball cracks from thermal stress which may cause electrical connection failure. Such cracks result from the mismatch of coefficient of thermal expansion (CTE). A packaging scheme more resistant to thermal stress is desirable.

BRIEF DESCRIPTION OF THE DRAWINGS

Reference is now made to the following descriptions taken in conjunction with the accompanying drawings, in which.

DETAILED DESCRIPTION

Figure 1A:
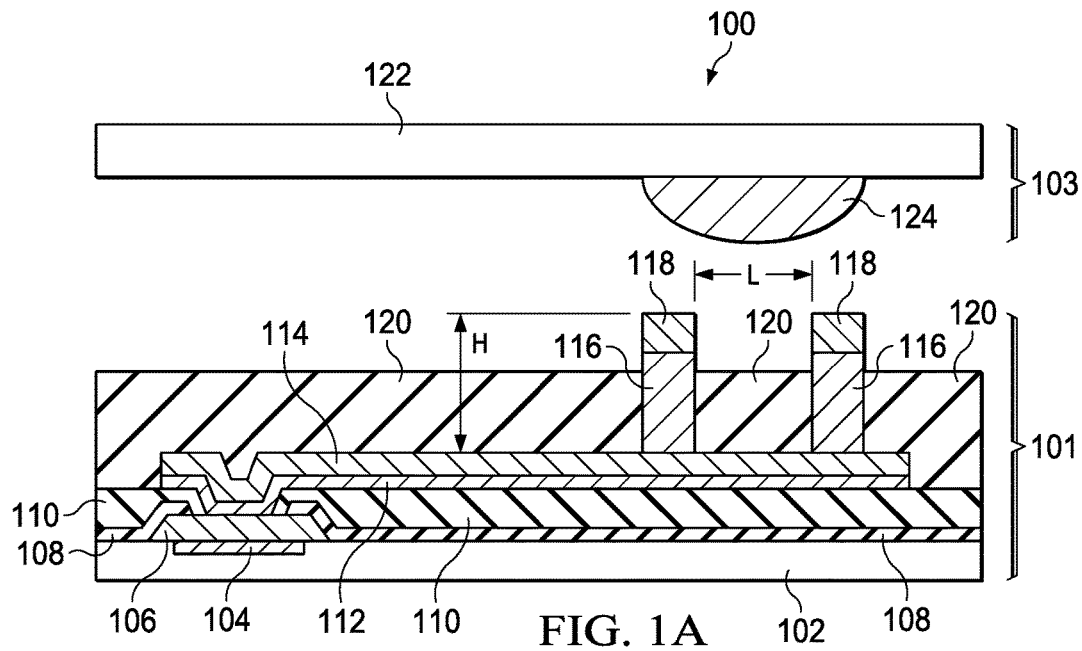
FIG. 1A is a cross section view of an exemplary hollow metal pillar package according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a cross section view of an exemplary hollow metal pillar package 100 according to some embodiments. The hollow metal pillar package 100 includes a bottom package 101 and a top package 103. The bottom package 101 includes a bottom substrate 102, a metal layer 104, a contact pad 106, passivation layers 108 and 110, a seed layer 112 and a metal layer 114 (e.g., a redistribution layer), a hollow metal pillar 116, solder layer 118, and a stress buffer layer 120. The top package 103 includes a top substrate 122 and a solder pad 124.

The bottom substrate 102 and the top substrate 122 comprise silicon, silicon dioxide, aluminum oxide, sapphire, germanium, gallium arsenide (GaAs), an alloy of silicon and germanium, indium phosphide (InP), silicon on insulator (SOI), or any other suitable material. The metal layer 104 is patterned for electrical wiring and comprises copper, aluminum, or any other suitable material. The contact pad 106 provides electrical connections and comprises copper, aluminum, or any other suitable material.

The passivation layers 108 and 110 provide insulation and protection for the surface below. In some embodiments, the passivation layer 108 comprises SiN/SiO and the passivation layer 110 comprises polymer material such as polybenzoxazole (PBO). The seed layer 112 facilitates the formation of the metal layer 114 (i.e., redistribution layer) above, and comprises copper with the metal layer 114 comprising copper in some embodiments.

The hollow metal pillar 116 provides electrical connection between the top package 103 and the bottom package 101. The hollow metal pillar 116 has a better thermal and electrical conductivity and reduced electromigration compared to a conventional solder ball.

The hollow metal pillar 116 comprises copper, aluminum, or any other suitable material. In some embodiments, the hollow metal pillar 116 has a height H of 80 μm-90 μm, an inner diameter L of 140 μm-160 μm, and a thickness T of about 40 μm-50 μm. In other embodiments, the size and dimension can be varied depending on applications.

The hollow metal pillar 116 provides proper standoff distance (height) between bottom substrate 102 and the top substrate 122, which also helps to have better temperature control. In one example, the hollow metal pillar 116 has a height of 90 μm due to a process specification. For example, some fabrication process using liquid molding compound (LMC) as the stress buffer layer 120 has a minimum thickness of 80 μm for the stress buffer layer 120, and the hollow metal pillar 116 should be higher than the stress buffer layer 120 for proper electrical connection.

The stress buffer layer 120 provides structural protection from stress and comprises liquid molding compound (LMC) in some embodiments. The stress buffer layer 120 increases the life time of the structure in the thermal cycle test by reducing the impact of coefficient of thermal expansion (CTE) mismatch of materials around the hollow metal pillar 116.

The hollow metal pillar 116 is higher than the stress buffer layer 120 by about 10 μm to ensure proper electrical contact with the solder pad 124 when the top package 103 is mounted on the bottom package 101 in some embodiments. The solder layer 118 and the solder pad 124 comprise SnAg or any other suitable material. The solder layer 118 has a height of about 10 μm-20 μm in some embodiments.

The hollow metal pillar package 100 saves cost and also provides better temperature cycle test results in life time cycle compared to other packaging schemes. The hollow metal pillar 116 has a better thermal and electrical conductivity and reduced electromigration compared to a conventional solder ball.

A person skilled in the art will understood that the top package 103 is simplified in FIG. 1A, and may have additional layers and features similar to the bottom package 101, such as metal layers, passivation layers, etc. Also, both the top package 103 and the bottom package 101 may include any other devices and components such as transistors, resistors, inductors, and capacitors among others.

Figure 1B:
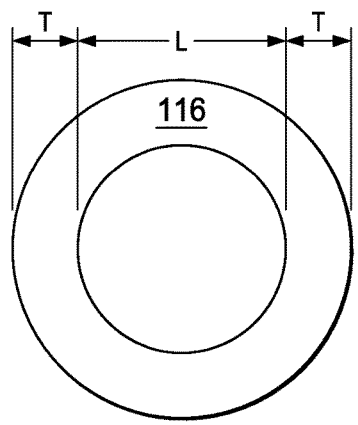
FIGS. 1B-1C are top views of exemplary hollow metal pillars according to some embodiments.
Figure 1C:
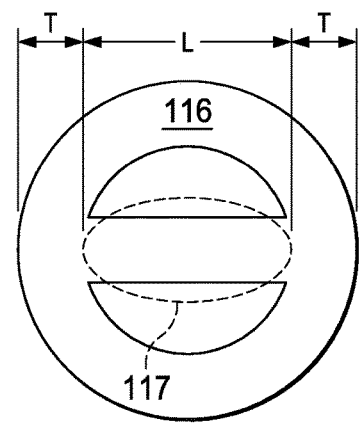

FIGS. 1B-1C are top views of exemplary hollow metal pillars 116 according to some embodiments. In FIG. 1B, the hollow metal pillar 116 has a cylindrical structure with a circular shape top view. In FIG. 1C, the hollow metal pillar 116 has a cylindrical structure with an inside divider 117 added to a circular shape in the top view. The inside divider 117 may increase the life time of the structure in the thermal cycle test for some embodiments.

The inside divider 117 provides better thermal conductivity (i.e., heat transfer) and may be aligned in the direction of coefficient of thermal expansion (CTE) mismatch. In other embodiments, the inside divider 117 may be arranged in a different shape, such as a cross shape with two lines crossing each other (i.e., "+" shape) instead of the one line shape (i.e., "–" shape).

In some embodiments, the hollow metal pillar 116 has a height H of about 80 μm-90 μm, an inner diameter L of 140 μm-160 μm, and a thickness T of about 40 μm-50 μm. In other embodiments, the size and dimension can be varied depending on applications.

Figure 2:
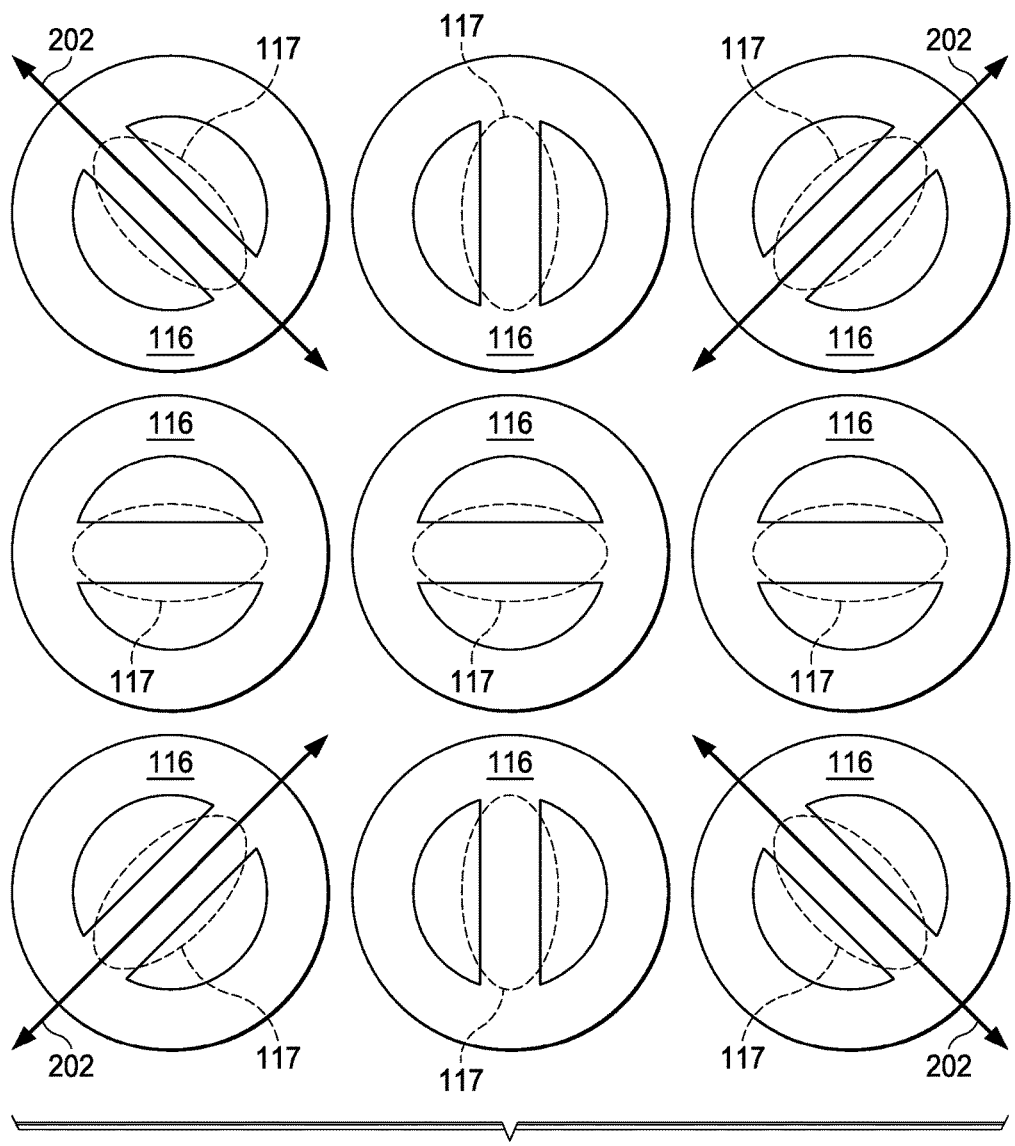
FIG. 2 is a top view of an exemplary arrangement of hollow metal pillars with inside dividers according to some embodiments.

FIG. 2 is a top view of an exemplary arrangement of hollow metal pillars 116 with inside dividers 117 according to some embodiments. The arrows 202 show the direction of CTE mismatch and the inside dividers 117 are aligned in the direction of the CTE mismatch. In other embodiments, the inside dividers 117 can be aligned to other directions depending on applications.

Figure 3A:
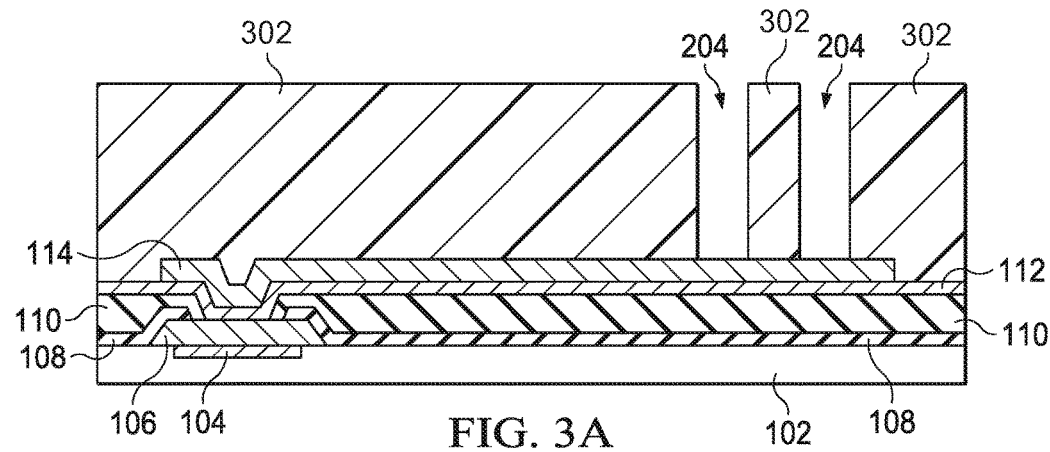
FIGS. 3A-3I are exemplary intermediate fabrication steps of the exemplary hollow metal pillar package in FIG. 1A according to some embodiments.

FIGS. 3A-3I are exemplary intermediate fabrication steps of the exemplary hollow metal pillar package in FIG. 1A according to some embodiments. In FIG. 3A, a photoresist 302 is deposited over the bottom substrate 102 and openings 204 for the hollow metal pillar 116 are formed by a photolithography process. The metal layer 104, the contact pad 106, passivation layers 108 and 110, the seed layer 112 and the metal layer 114 (e.g., a redistribution layer) can be formed by any known method in the art.

Figure 3B:
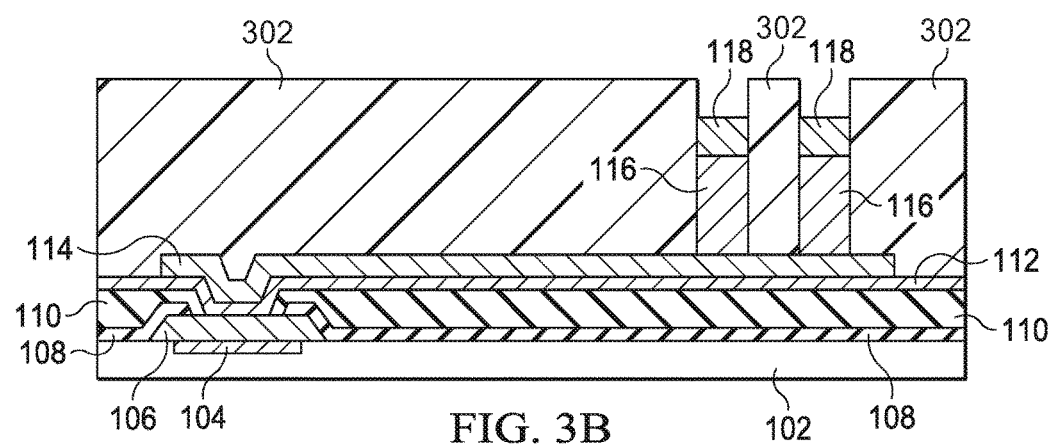

In FIG. 3B, the hollow metal pillar 116 and the solder layer 118 are deposited in the openings 204 by electroplating process, for example. In some embodiments, plasma cleaning such as $O_2$ plasma process can be performed prior to the deposition. The hollow metal pillar 116 comprises copper, aluminum, or any other suitable material. In some embodiments, the hollow metal pillar 116 has a height H of about 80 μm-90 μm, an inner diameter L of 140 μm-160 μm, and a thickness T of about 40 μm-50 μm. In other embodiments, the size and dimension can be varied depending on applications.

The hollow metal pillar 116 provides electrical connection between the top package 103 and the bottom package 101 in FIG. 1A. The hollow metal pillar 116 has a better thermal and electrical conductivity and reduced electromigration compared to a conventional solder ball. The solder layer 118 comprises SnAg or any other suitable material. The solder layer 118 has a height of about 10 μm-20 μm in some embodiments.

Figure 3C:
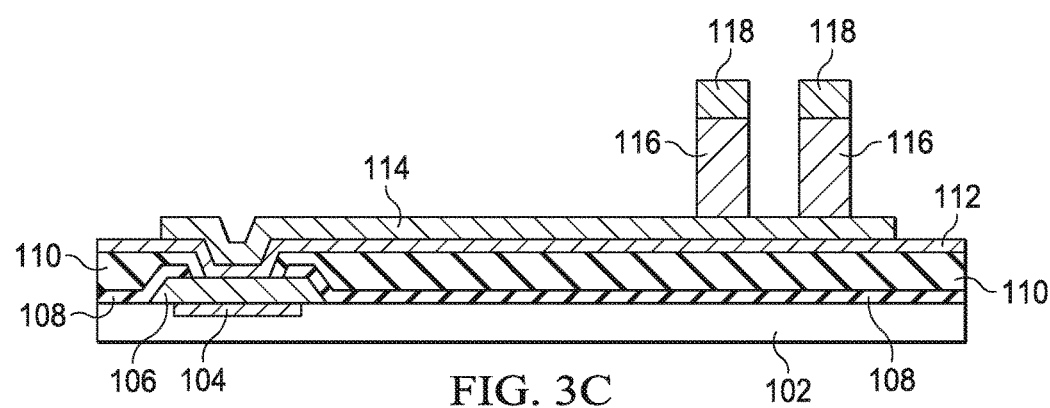

In FIG. 3C, the photoresist 302 is removed by a wet etching process, for example.

Figure 3D:
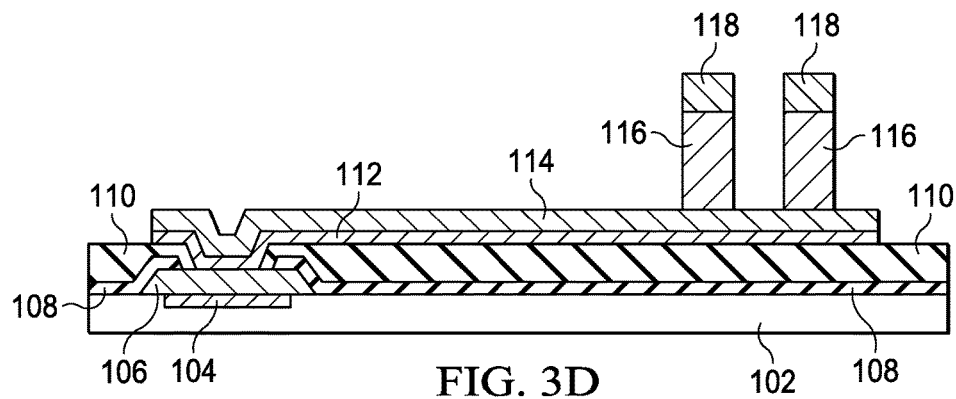

In FIG. 3D, the seed layer 112 outside of the metal layer 114 is removed by an etching process, for example.

Figure 3E:
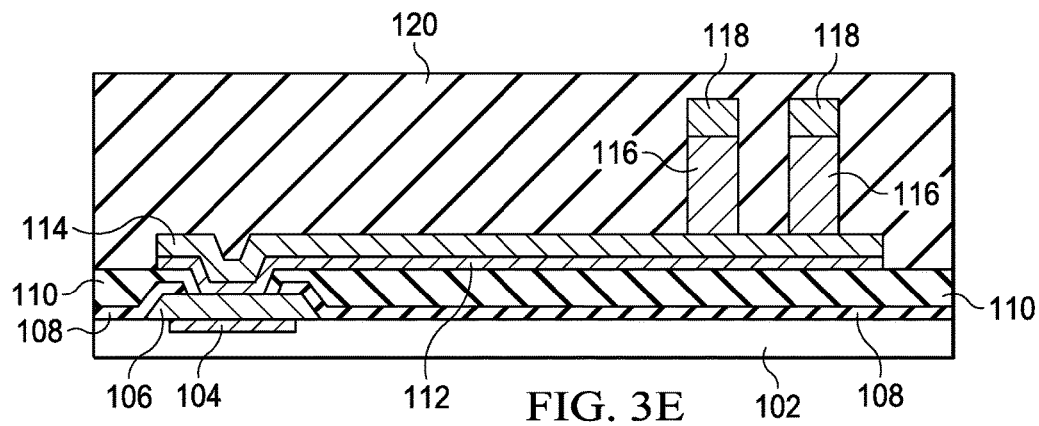

In FIG. 3E, the stress buffer layer 120 (e.g., liquid molding compound) is formed over the metal layer 114, the hollow metal pillar 116 and the solder layer 118 by coating, for example. The stress buffer layer 120 comprises polymer in some embodiments.

Figure 3F:
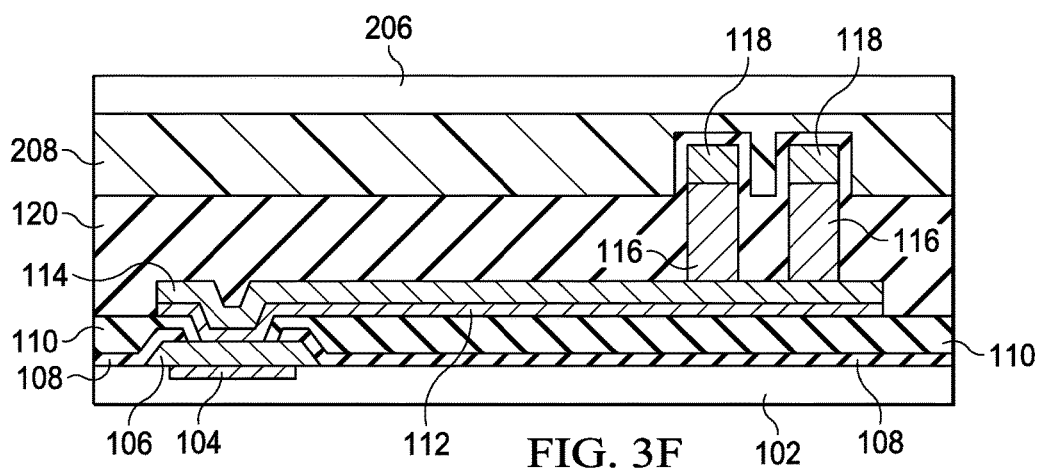

In FIG. 3F, a release film 208 mounted on a carrier 206 is pressed on the stress buffer layer 120. In some embodiments, the release film 208 comprises polymer material and has a thickness of about 100 μm. In some embodiments, the release film 208 is pressured with about 300 kN clamping force and the stress buffer layer 120 is cured with a thermal process for about 7 minutes at about 150° C. temperature.

Figure 3G:
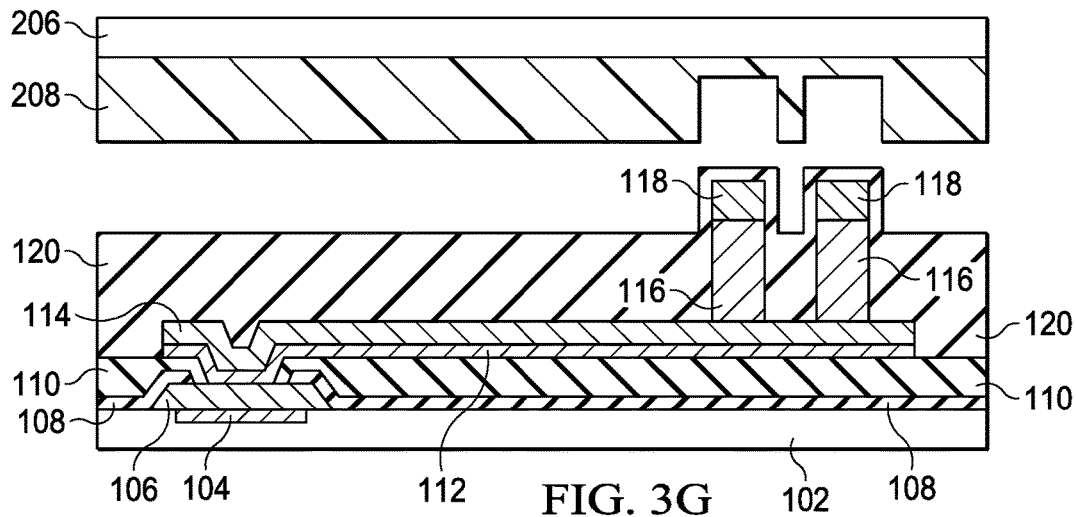

In FIG. 3G, the release film 208 is removed.

Figure 3H:
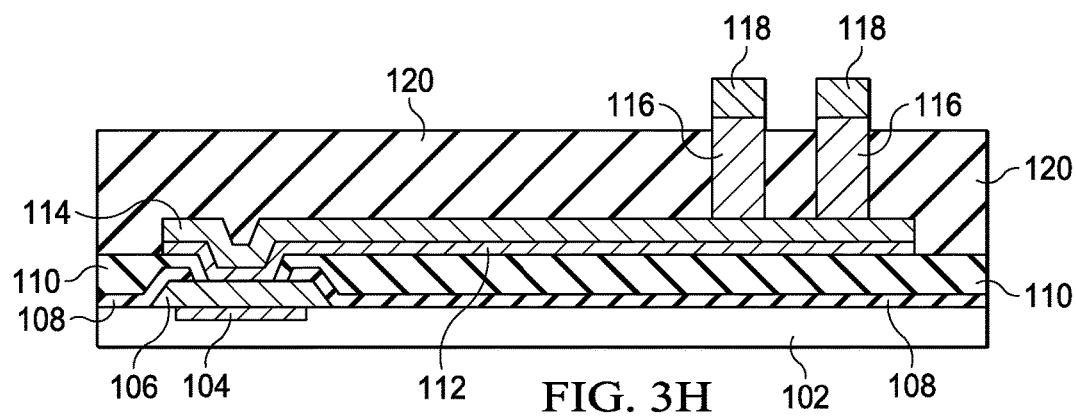

In FIG. 3H, the stress buffer layer 120 is plasma cleaned to expose the solder layer 118 and the top portion of the hollow metal pillar 116. In some embodiments, the plasma cleaning uses $Ar/O_2$ for 60 seconds.

Figure 3I:
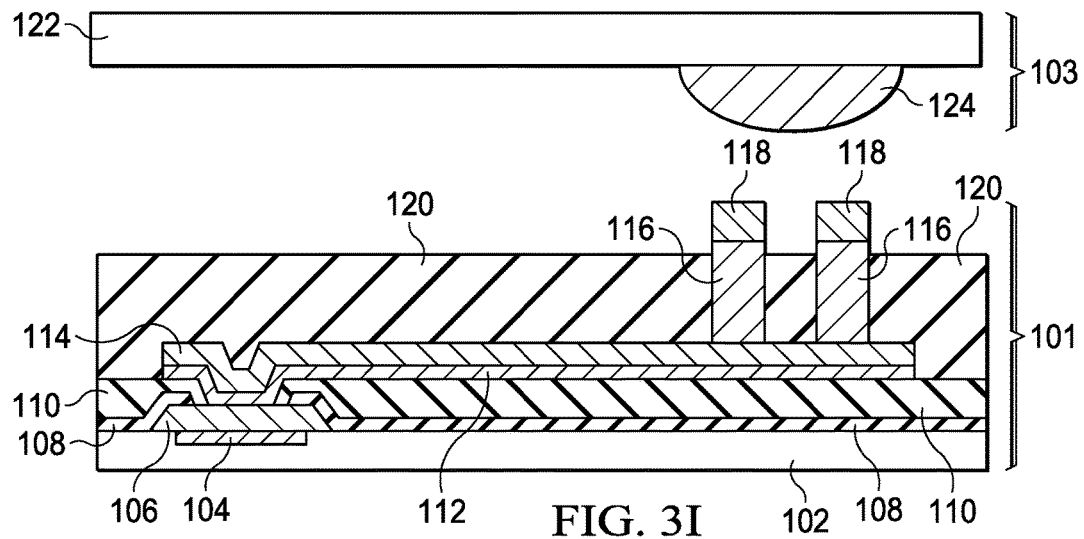

In FIG. 3I, the top package 103 including the top substrate 122 and the solder pad 124 is mounted to the bottom package 101 with the solder layer 118. Then the solder pad 124 and solder layer 118 are reflowed to electrically connect the top package 103 and the hollow metal pillar 116 of the bottom package 101 in some embodiments.

According to some embodiments, an integrated circuit includes a bottom substrate, a metal layer disposed over the bottom substrate and a hollow metal pillar disposed on the metal layer. The metal layer and the hollow metal pillar are electrically connected.

According to some embodiments, a method includes forming a metal layer over a bottom substrate. A hollow metal pillar is formed on the metal layer. The metal layer and the hollow metal pillar are electrically connected.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

In one aspect, embodiments described herein may provide for a method that includes forming a metal layer over a bottom substrate, forming a hollow metal pillar on the metal layer, wherein the metal layer and the hollow metal pillar are electrically connected.

In another aspect, embodiments described herein may provide for a method that includes forming a patterning layer over a package structure having a conductor thereon, the patterning layer having an annular pattern exposing a portion of the conductor, and depositing a first conductive material within the annular pattern. The method further includes depositing a second conductive material within the annular pattern and on the first conductive material, and removing the patterning layer.

In yet other aspects, embodiments described herein may provide for a method that includes forming a hollow metal pillar on a metal layer of a first device, wherein the metal layer and the hollow metal pillar are electrically connected, encapsulating the hollow metal pillar in a stress buffer material, and removing an upper surface of the stress buffer material to expose an upper surface of the hollow metal pillar.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   forming a metal layer over a bottom substrate;
   forming a hollow metal pillar on the metal layer, wherein the metal layer and the hollow metal pillar are electrically connected; and
   forming a stress buffer layer on the metal layer after forming the hollow metal pillar, wherein the stress buffer layer fills inside the hollow metal pillar and surrounds the hollow metal pillar.

2. The method of claim 1, further comprising:
   pressuring the stress buffer layer with a release film; and
   curing the stress buffer layer.

3. The method of claim 1, further comprising forming a passivation layer between the bottom substrate and the metal layer.

4. The method of claim 1, further comprising forming a solder layer on the hollow metal pillar.

5. The method of claim 4, further comprising mounting a top package over the solder layer.

6. The method of claim 5, further comprising reflowing the solder layer to electrically connect the top package and the hollow metal pillar.

7. The method of claim 1, wherein the hollow metal pillar comprises copper.

8. The method of claim 1, further comprising forming a contact pad between the metal layer and the bottom substrate wherein the contact pad and the metal layer are electrically connected.

9. A method, comprising:
   forming a patterning layer over a package structure having a conductor thereon, the patterning layer having an annular pattern exposing a portion of the conductor;
   depositing a first conductive material within the annular pattern;
   depositing a second conductive material within the annular pattern and on the first conductive material, the second conductive material being different from the first conductive material; and
   removing the patterning layer.

10. The method of claim 9, wherein an annular metal pillar remains after the step of removing the patterning layer and further comprising:
    filling a region within the annular metal pillar with a stress buffer layer.

11. The method of claim 10, wherein the step of filling a region within the annular metal pillar with a stress buffer layer includes:
    encapsulating the annular metal pillar in a stress buffer material; and
    removing some of the stress buffer material so that a topmost surface of the stress buffer material is below a topmost surface of the annular metal pillar.

12. The method of claim 11, wherein the step of encapsulating the annular metal pillar in a stress buffer material includes depositing a polymer or a liquid molding compound.

13. The method of claim 11, wherein the step of removing some of the stress buffer material includes pressing a release film onto the topmost surface of the stress buffer material to depress the topmost surface.

14. The method of claim 11 wherein the step of removing some of the stress buffer material includes exposing the topmost surface of the stress buffer material to a plasma clean process.

15. The method of claim 14, wherein the plasma clean process includes a process using argon and oxygen.

16. The method of claim 10, wherein
    the step of depositing a first conductive material within the annular pattern includes electroplating copper; and
    the step of depositing a second conductive material within the annular pattern and on the first conductive material comprises depositing solder on the copper.

17. A method, comprising:
    forming a hollow metal pillar on a metal layer of a first device, wherein the metal layer and the hollow metal pillar are electrically connected;
    after the step of forming the hollow metal pillar, encapsulating the hollow metal pillar in a stress buffer material; and
    removing an upper surface of the stress buffer material to expose an upper surface of the hollow metal pillar.

18. The method of claim 17, wherein the step of removing an upper surface of the stress buffer material includes pressing a release film onto the upper surface of the stress buffer material to press the upper surface of the stress buffer material to below the upper surface of the hollow metal pillar.

19. The method of claim 17, further including removing a portion of the stress buffer material using a plasma clean process.

20. The method of claim 1, further comprising removing a portion of the stress buffer layer disposed on a topmost surface of the hollow metal pillar.

* * * * *